(12) United States Patent
Tzeng et al.

(10) Patent No.: US 6,661,049 B2
(45) Date of Patent: Dec. 9, 2003

(54) MICROELECTRONIC CAPACITOR STRUCTURE EMBEDDED WITHIN MICROELECTRONIC ISOLATION REGION

(75) Inventors: Kuo-Chyuan Tzeng, Hsin-Chu (TW); Chen-Jong Wang, Hsin-Chu (TW); Chung-Wei Chang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/947,793

(22) Filed: Sep. 6, 2001

(65) Prior Publication Data
US 2003/0042519 A1 Mar. 6, 2003

(51) Int. Cl.$^7$ ............................................. H01L 29/772
(52) U.S. Cl. ...................... 257/296; 257/71; 257/303; 257/305; 257/397; 257/513; 257/516
(58) Field of Search ................. 257/68, 71, 296, 257/301, 305, 303, 396, 397, 510, 513, 516, 534, 906, 908

(56) References Cited

U.S. PATENT DOCUMENTS

| | | | |
|---|---|---|---|
| 4,786,954 A | | 11/1988 | Morie et al. |
| 5,736,761 A | * | 4/1998 | Risch et al. |
| 6,008,515 A | | 12/1999 | Hsia et al. |
| 6,087,214 A | | 7/2000 | Cunningham |
| 6,177,697 B1 | * | 1/2001 | Cunningham |
| 6,306,724 B1 | * | 10/2001 | Chen |
| 6,426,253 B1 | * | 7/2002 | Tews et al. |
| 2001/0052610 A1 | * | 12/2001 | Leung et al. |

* cited by examiner

*Primary Examiner*—George Fourson
*Assistant Examiner*—Joannie Adelle Garcia
(74) *Attorney, Agent, or Firm*—Tung & Associates

(57) ABSTRACT

Within a method for fabricating a capacitor structure, and a capacitor structure fabricated employing the method, there is formed within an isolation region adjoining an active region of a semiconductor substrate a laterally asymmetric trench which leaves exposed an upper sidewall portion of the active region of the semiconductor substrate. There is then formed within the laterally asymmetric trench a capacitor node layer which contacts the exposed upper sidewall portion of the active region of the semiconductor substrate and extends above the active region of the semiconductor substrate. The capacitor may be a storage capacitor with increased capacitance fabricated within a memory cell structure of decreased dimensions.

4 Claims, 2 Drawing Sheets

MICROELECTRONIC CAPACITOR STRUCTURE EMBEDDED WITHIN MICROELECTRONIC ISOLATION REGION

BACKGROUND OF THE INVENTION

1. Field of the Invention

The present invention relates generally to capacitor structures formed within microelectronic fabrications. More particularly, the present invention relates to capacitor structures formed within semiconductor integrated circuit microelectronic fabrications.

2. Description of the Related Art

Microelectronic fabrications are formed from microelectronic substrates over which are formed patterned microelectronic conductor layers which are separated by microelectronic dielectric layers.

Common in the art of microelectronic fabrication, and in particular in the art of semiconductor integrated circuit microelectronic memory fabrication, is the use and the fabrication of memory cell structures, and in particular dynamic random access memory (DRAM) cell structures. Dynamic random access memory (DRAM) cell structures typically comprise a field effect transistor (FET) device formed within and upon a semiconductor substrate, where one of a pair of source/drain regions within the field effect transistor (FET) device has a storage capacitor formed thereover and electrically connected therewith. Within a dynamic random access memory (DRAM) cell structure, a gate electrode of the field effect transistor (FET) device serves as a wordline which provides a switching function for charge introduction into and retrieval from the storage capacitor, while the other of the pair of source/drain regions within the field effect transistor (FET) device serves as a contact for a bitline conductor layer which introduces or retrieves charge with respect to the storage capacitor.

While the dynamic random access memory (DRAM) cell structure has clearly become ubiquitous in the art of semiconductor integrated circuit microelectronic fabrication, and is thus essential in the art of semiconductor integrated circuit microelectronic fabrication, the dynamic random access memory (DRAM) cell structure is nonetheless not entirely without problems in the art of semiconductor integrated circuit microelectronic fabrication.

In that regard, as semiconductor integrated circuit microelectronic fabrication integration levels have increased and semiconductor device and patterned conductor layer dimensions have decreased, it has become increasingly difficult in the art of semiconductor integrated circuit microelectronic fabrication, and in particular in the art of semiconductor integrated circuit microelectronic memory fabrication, to fabricate within dynamic random access memory (DRAM) cell structures of decreased dimension storage capacitors of increased capacitance.

It is thus desirable in the art of microelectronic fabrication, and in particular in the art of semiconductor integrated circuit microelectronic memory fabrication, to provide methods and materials through which there may be fabricated within memory cell structures of decreased dimensions storage capacitor structures with increased capacitance.

It is towards the foregoing object that the present invention is directed.

Various memory cell structures having desirable properties, and methods for fabrication thereof, have been disclosed in the art of semiconductor integrated circuit microelectronic fabrication.

Included among the memory cell structures, but not limited among the memory cell structures, are memory cell structures disclosed within: (1) Morie et al., in U.S. Pat. No. 4,786,954 (a memory cell structure with enhanced integration density and enhanced electrical performance effected by fabricating within the memory cell structure a trench storage capacitor rather than a planar storage capacitor); (2) Hsia et al., in U.S. Pat. No. 6,008,515 (a memory cell structure having formed therein a storage capacitor with enhanced areal capacitance by forming a capacitor node dielectric layer into which is formed a capacitor node layer within the storage capacitor with a corrugated sidewall rather than a smooth sidewall); and (3) Cunningham, in U.S. Pat. No. 6,087,214 (a memory cell structure with enhanced integration density by fabricating within the memory cell structure a metal-insulator-semiconductor (MIS) capacitor upon a semiconductor substrate having formed therein a trench).

Desirable in the art of microelectronic fabrication, and in particular in the art of semiconductor integrated circuit microelectronic memory fabrication, are additional methods and materials through which there may be fabricated within memory cell structures of decreased dimensions storage capacitor with increased capacitance.

It is towards the foregoing object that the present invention is directed.

SUMMARY OF THE INVENTION

A first object of the invention is to provide a capacitor structure for use within a microelectronic fabrication.

A second object of the present invention is to provide a capacitor structure in accord with the first object of the present invention, wherein the capacitor structure may be fabricated with increased capacitance within a memory cell structure of decreased dimensions.

In accord with the objects of the present invention, there is provided by the present invention a method for fabricating a capacitor structure, and a capacitor structure fabricated in accord with the method.

To practice the method of the present invention, there is first provided a semiconductor substrate having formed therein an isolation region adjoining an active region of the semiconductor substrate. There is then etched the isolation region to form therein a laterally asymmetric trench bounded at one of its sides by a sidewall of the active region of the semiconductor substrate and at the remainder of its sides by a remaining portion of the isolation region. There is then formed into the laterally asymmetric trench a capacitor node layer which contacts the sidewall of the active region of the semiconductor substrate and rises above active region of the semiconductor substrate. There is then formed upon the capacitor node layer a capacitor dielectric layer. Finally, there is then formed upon the capacitor dielectric layer a capacitor plate layer.

The method of the present invention contemplates a capacitor structure fabricated in accord with the method of the present invention.

The present invention provides a capacitor structure for use within a microelectronic fabrication, wherein the capacitor structure may be fabricated with increased capacitance within a memory cell structure of decreased dimensions.

The present invention realizes the foregoing object by forming a capacitor structure in accord with the present invention within a laterally asymmetric trench within an isolation region which adjoins an active region of a semiconductor substrate such that a capacitor node layer when formed into the laterally asymmetric trench adjoins a sidewall of the active region of the semiconductor substrate and rises above a horizontal plane of the active region of the semiconductor substrate.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a capacitor structure for use within a microelectronic fabrication, wherein the capacitor structure may be fabricated with increased capacitance within a memory cell structure of decreased dimensions.

The present invention realizes the foregoing object by forming the capacitor structure within a laterally asymmetric trench within a isolation region which adjoins an active region of a semiconductor substrate such that a capacitor node layer when formed into the laterally asymmetric trench adjoins a sidewall of the active region of the semiconductor substrate and rises above a horizontal plane of the active region of the semiconductor substrate.

While the preferred embodiment of the present invention illustrates the present invention most particularly within the context of forming a capacitor structure within a dynamic random access memory (DRAM) cell structure, the present invention may nonetheless also be employed for forming capacitors within memory cell structures other than dynamic random access memory (DRAM) cell structures. Such other memory cell structures may include, but are not limited to static random access memory (SRAM) cell structures which may also require contact of a capacitor node layer within a storage capacitor with increased capacitance with an active region of a semiconductor substrate.

Referring now to FIG. 1 to FIG. 6, there is shown a series of schematic cross-sectional diagrams illustrating the results of progressive stages in forming, in accord with a preferred embodiment of the present invention, a storage capacitor within a dynamic random access memory (DRAM) cell within a semiconductor integrated circuit microelectronic fabrication.

Figure 1:
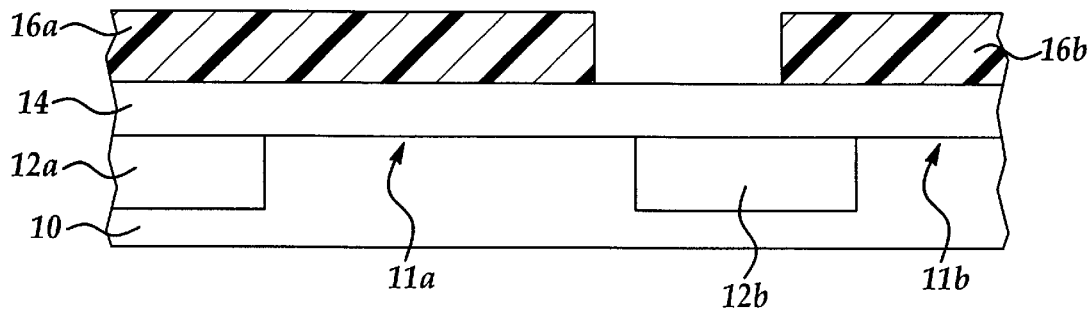
FIG. 1, FIG. 2, FIG. 3, FIG. 4, FIG. 5 and FIG. 6 show a series of schematic cross-sectional diagrams illustrating the results of progressive stages in forming, in accord with a preferred embodiment of the present invention, a storage capacitor within a dynamic random access memory (DRAM) cell within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a pair of isolation regions 12a and 12b which define at least in part a pair of active regions 11a and 11b of the semiconductor substrate 10. Within the present invention, including the claims, the semiconductor substrate 10 and the pair of isolation regions 12a and 12b are intended to serve as a horizontal reference plane upon or over which are formed additional vertically spaced layers when forming a capacitor structure in accord with the present invention. The semiconductor substrate 10 need not actually, however, be horizontally disposed when forming those additional vertically spaced layers.

Within the preferred embodiment of the present invention with respect to the semiconductor substrate 10, and although semiconductor substrates are known in the art of semiconductor integrated circuit microelectronic fabrication with either dopant polarity, several dopant concentrations and various crystallographic orientations, for the preferred embodiment of the present invention the semiconductor substrate 10 is typically and preferably a (100) silicon semiconductor substrate having at least either N- or P-doped regions.

Similarly, within the preferred embodiment of the present invention with respect to the pair of isolation regions 12a and 12b, and although it is also known in the art of semiconductor integrated circuit microelectronic fabrication that isolation regions may be formed employing methods including but not limited to isolation regions thermal growth methods and isolation region deposition/patterning methods, for the preferred embodiment of the present invention the isolation regions 12a and 12b are, as is illustrated within the schematic cross-sectional diagram of FIG. 1, formed as shallow trench isolation (STI) regions. They are generally formed at least in part of a silicon oxide material formed recessed within the semiconductor substrate 10 to define a series of moats annularly surrounding a series of active regions, including the active regions 11a and 11b, of the semiconductor substrate. The present invention may, however, also be practiced within the context of a semiconductor substrate having formed therein an isolation region which is formed as local oxidation of silicon (LOCOS) isolation region or a deep trench isolation region.

Shown also within the schematic cross-sectional diagram of FIG. 1, and formed upon the active region of the semiconductor substrate and the pair of isolation regions 12a and 12b, is a blanket capacitor node dielectric layer 14. Similarly, there is also shown within the schematic cross-sectional diagram of FIG. 1, and formed upon the blanket capacitor node dielectric layer 14, a pair of patterned photoresist layers 16a and 16b which is offset with respect to the isolation region 12b.

Within the preferred embodiment of the present invention with respect to the blanket capacitor node dielectric layer 14, the blanket capacitor node dielectric layer may be formed of dielectric materials as are conventional in the art of semiconductor integrated circuit microelectronic fabrication, including but not limited to silicon oxide dielectric materials, silicon nitride dielectric materials and silicon oxynitride dielectric materials, although silicon oxide dielectric materials as preferred. Typically and preferably, the blanket capacitor node dielectric layer 14 is formed to a thickness of from about 1000 to about 2000 angstroms of a silicon oxide dielectric material that is typically less dense, and etches more rapidly, than a silicon oxide dielectric material from which is preferably formed in part the pair of isolation regions 12a and 12b.

Within the preferred embodiment of the present invention with respect to the pair of patterned photoresist layers 16a and 16b, the pair of patterned photoresist layers 16a and 16b may also be formed of photoresist materials as are conventional in the art of microelectronic fabrication, typically and preferably formed to a thickness of from about 6000 to about 8000 angstroms each.

Figure 2:
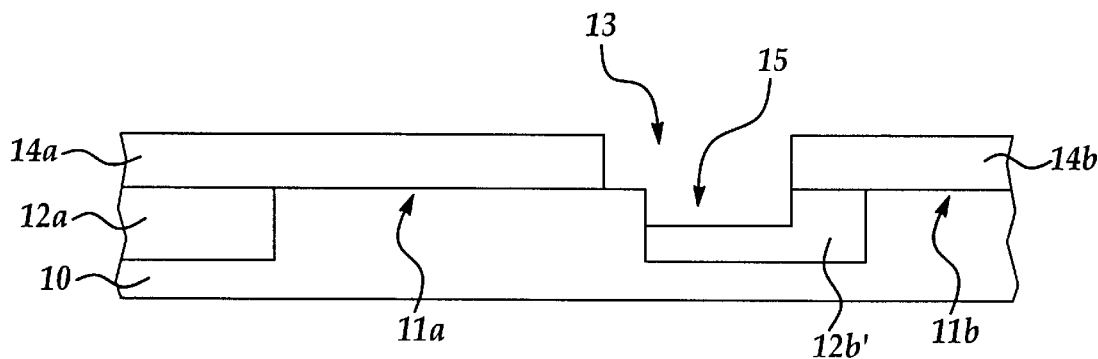

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket capacitor node dielectric layer 14 has been patterned to form a pair of patterned capacitor node dielectric layers 14a and 14b while employing the pair of patterned photoresist layers 16a and 16b as a pair of etch mask layers. Similarly, when undertaking such patterning within the context of the present invention, there is also etched within the isolation region 12b a laterally asymmetric trench 15 to form therefrom a partially etched isolation region 12b'. Together, the laterally asymmetric trench 15 and the pair of patterned capacitor node dielectric layers 14a and 14b form an aperture 13. Within the present invention, the laterally asymmetric trench 15 is bounded on one side by an exposed upper portion of a sidewall of the active region 11a of the semiconductor substrate 10, while also leaving exposed an adjacent top surface portion of the active region 11a of the semiconductor substrate 10. Similarly, the laterally asymmetric trench 15 is bounded at other sidewall and bottom regions by the partially etched isolation region 12b'.

Typically and preferably, the laterally asymmetric trench 15 has a bidirectional (i.e., areal) linewidth of from about 0.41 to about 0.52 microns within the partially etched isolation region 12b' and a depth of from about 2000 to about 2500 angstroms within the partially etched isolation region 12b'.

After having etched through the blanket capacitor node dielectric layer 14 to form the aperture 13 which includes the laterally asymmetric trench 15, there is also stripped from the resulting semiconductor integrated circuit microelectronic fabrication the pair of patterned photoresist layers 16a and 16b, as illustrated within the schematic cross-sectional diagram of FIG. 2.

Figure 3:
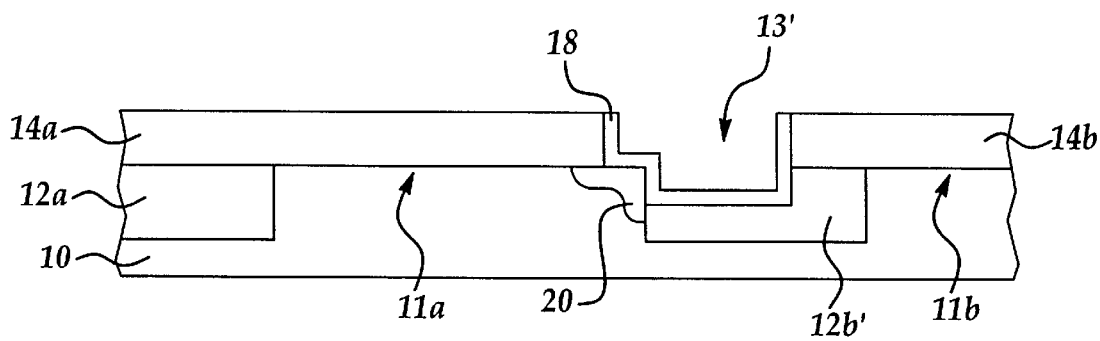

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein there is formed into the aperture 13 as illustrated within the schematic cross-sectional diagram of FIG. 2 a patterned conformal capacitor node layer 18 which contacts the exposed upper sidewall portion and top surface portion of the active region 11a of the semiconductor substrate 10.

Within the present invention, the patterned conformal capacitor node layer 18 is typically and preferably formed employing a blanket conformal layer deposition and planarizing method, preferably a chemical mechanical polish (CMP) planarizing method, which may also employ a sacrificial filler layer to fill a second aperture 13' defined within the blanket conformal capacitor node layer when planarizing the blanket conformal capacitor node layer to form therefrom the patterned conformal capacitor node layer 18. Typically and preferably the patterned conformal capacitor node layer 18 is formed to a thickness of from about 300 to about 500 angstroms from a doped polysilicon material. The doped polysilicon material may be intrinsically doped as it is formed, or in an alternative, the doped polysilicon material may be extrinsically doped while employing an ion implantation processing method.

Finally, there is also shown within the schematic cross-sectional diagram of FIG. 2 a doped region 20 within the sidewall portion and top surface portion of the active region 11a of the semiconductor substrate 10 which is contacted by the patterned conformal capacitor node layer 18.

Within the present invention, the doped region is effected at least in part through an out diffusion of a dopant which is employed for doping the patterned conformal capacitor node layer 18 when the same is formed of the doped polysilicon material as disclosed above.

Figure 4:
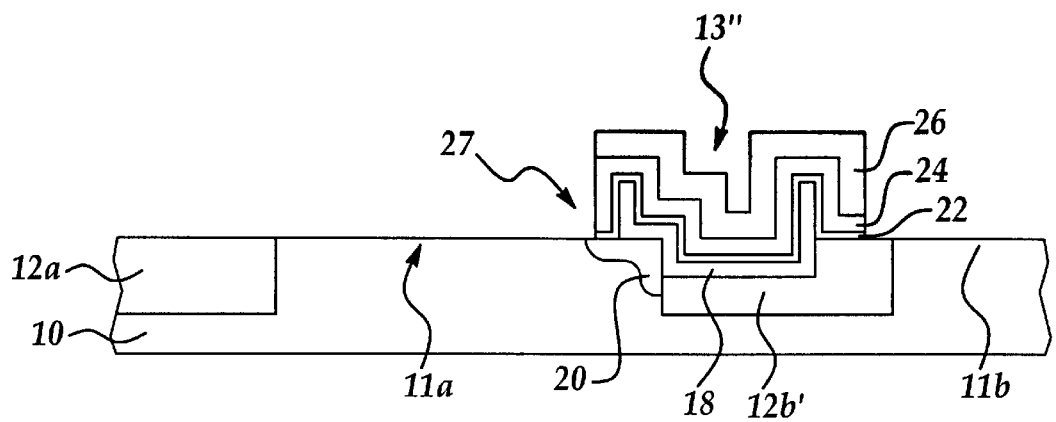

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the pair of patterned capacitor node dielectric layers 14a and 14b has been stripped from the semiconductor integrated circuit microelectronic fabrication.

The pair of patterned capacitor node dielectric layers may be stripped from the semiconductor integrated circuit microelectronic fabrication whose schematic cross-sectional diagram is illustrated in FIG. 3 to provide in part the semiconductor integrated circuit microelectronic fabrication whose schematic cross-sectional diagram is illustrated in FIG. 4 while employing stripping methods as are conventional in the art of semiconductor integrated circuit microelectronic fabrication. Such stripping methods may include, but are not limited to, wet chemical stripping methods and dry plasma stripping methods.

Shown also within the schematic cross-sectional diagram of FIG. 4 and formed conformally upon the patterned capacitor node dielectric layer 18 and bridging from the active region 11a of the semiconductor substrate 10 to the partially etched isolation region 12b', is a series of patterned conformal layers which is formed by patterning of a series of corresponding blanket conformal layers which are not otherwise illustrated within the present description.

The series of patterned conformal layers includes: (1) a patterned conformal capacitor dielectric layer 22 formed upon the patterned conformal capacitor node layer 18 and bridging to the active region 11a of the semiconductor substrate 10 and the partially etched isolation region 12b'; (2) a patterned conformal upper capacitor plate 24 formed upon the patterned conformal capacitor dielectric layer 22; and (3) a patterned conformal isolation dielectric layer 26 formed upon the patterned conformal upper capacitor plate 24, where the patterned conformal isolation dielectric layer 26 has defined within its center a third aperture 13".

Within the preferred embodiment of the present invention, each of the three foregoing patterned conformal layers may be formed employing methods and materials as are conventional in the art of semiconductor integrated circuit microelectronic fabrication.

Typically and preferably, the patterned conformal capacitor dielectric layer 22 is formed of a silicon oxide/silicon nitride laminate as is otherwise conventional in the art of semiconductor integrated circuit microelectronic fabrication, and formed to a thickness of from about 40 to about 70 angstroms. Similarly, the patterned conformal upper capacitor plate layer 24 is formed employing methods, materials and thickness dimensions analogous or equivalent to the methods, materials and thickness dimensions employed for forming the patterned conformal capacitor node layer 18. Finally, the patterned conformal isolation dielectric layer 26 may be formed from any of several isolation dielectric materials as are conventional in the art of semiconductor integrated circuit microelectronic fabrication, but will typically and preferably be formed of a silicon nitride isolation dielectric material or a silicon oxynitride isolation dielectric material, such as to provide for optimal etch selectivity.

As is understood by a person skilled in the art, within the schematic cross-sectional diagram of FIG. 4, the patterned conformal capacitor node layer 18, the patterned conformal capacitor dielectric layer 22 and the patterned conformal upper capacitor plate layer 24 form a storage capacitor 27 formed in part within the laterally asymmetric trench 15 and embedded within the partially etched isolation region 12b', and also rising above the plane of the active region 11a of the semiconductor substrate 10. Within the storage capacitor 27, the patterned conformal capacitor node layer 18 is electrically connected to the active region 11a of the semiconductor substrate 10 through the doped region 20 formed therein.

Figure 5:
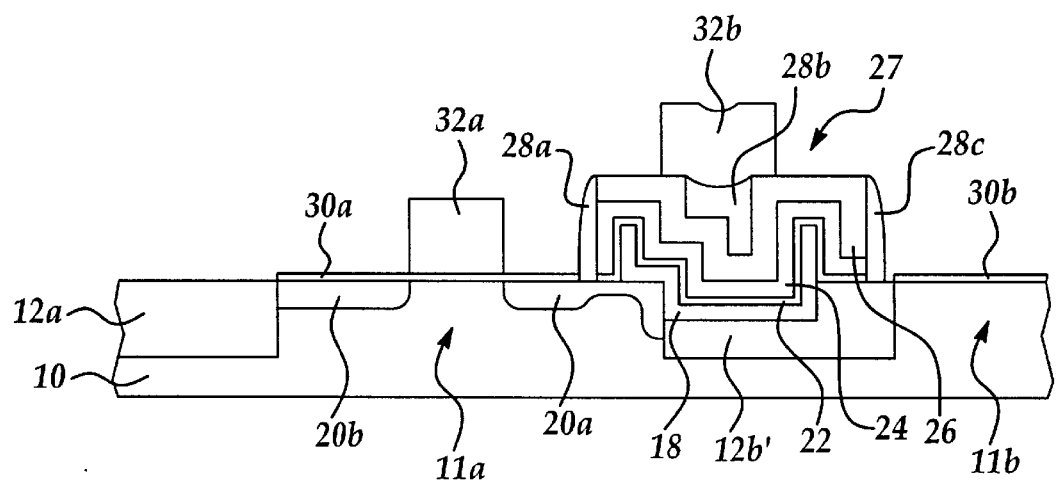

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, there is formed a series of first spacer layers 28a, 28b and 28c formed adjoining a pair of sidewalls of the storage capacitor 27, as well as filling the third aperture 13" defined by the patterned isolation dielectric layer 26 and centered over the storage capacitor 27.

Within the present invention, the series of spacer layers 28a, 28b and 28c may be formed employing methods and materials as are conventional in the art of semiconductor integrated circuit microelectronic fabrication, but will typically and preferably be formed of a dielectric material of composition different than the patterned conformal isolation dielectric layer 26.

Shown also within the schematic cross-sectional diagram of FIG. 4 formed upon the active regions 11a and 11b of the semiconductor substrate 10 is a pair of gate dielectric layers 30a and 30b.

Within the preferred embodiment of the present invention, the pair of gate dielectric layers 30a and 30b may be formed employing thermal growth methods or deposition/patterning methods as are conventional in the art of semiconductor integrated circuit microelectronic fabrication, to form the pair of gate dielectric layers 30a and 30b typically and preferably of a thickness from about 20 to about 30 angstroms formed upon the active regions 11a and lib of the semiconductor substrate 10.

Finally, there is also shown within the schematic cross-sectional diagram of FIG. 4 a gate electrode 32a formed upon the gate dielectric layer 30a and an interconnect layer 32b formed over the storage capacitor 27 and upon the first spacer layer 28b, while spanning between separated portions of the patterned conformal isolation dielectric layer 26.

Within the preferred embodiment of the present invention, the gate electrode 32a and the interconnect layer 32b may be formed employing methods and materials as are conventional in the art of semiconductor integrated circuit microelectronic fabrication, and will typically and preferably be simultaneously formed through patterning of a single blanket polysilicon layer or blanket polycide layer formed to a thickness of from about 1500 to about 2500 angstroms.

Finally, there is also shown within the schematic cross-sectional diagram of FIG. 4 a pair of lightly doped extension regions 20a and 20b which is formed into the active region 11a of the semiconductor substrate 10 while employing the gate electrode 32a and the capacitor structure 27 (including the first spacer layer 28a) as a mask. Typically and preferably, the pair of lightly doped extension regions 20a and 20b is formed employing an ion implantation method at an ion implantation dose of from about 1E13 to about 5E14 dopant ions per square centimeter and an ion implantation energy of from about 2 to about 30 keV.

As is illustrated within the schematic cross-sectional diagram of FIG. 5, the lightly doped extension region 20b thermally diffuses to incorporate therein the doped region 20 as illustrated within the schematic cross-sectional diagram of FIG. 4, thus providing a conductive region within the active region 11a of the semiconductor substrate 10 starting at the gate electrode 32a edge and ending at the patterned conformal capacitor node layer 18 within the storage capacitor 27.

Figure 6:
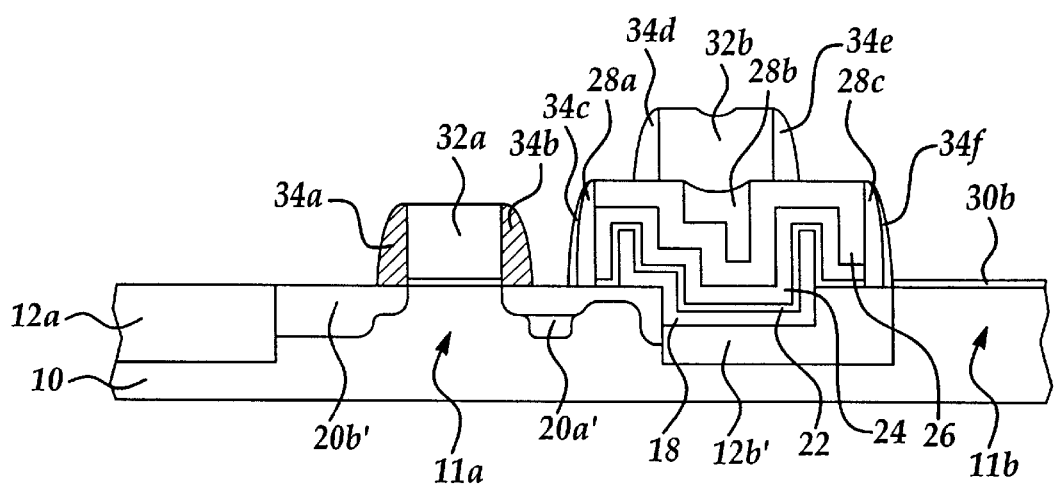

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is formed adjoining: (1) a pair of sidewalls of the gate electrode 32a; (2) a pair of sidewalls of the pair of first spacer layers 28a and 28c; and (3) a pair of sidewalls of the interconnect layer 32b, a series of second spacer layers 34a, 34b, 34c, 34d, 34e and 34f.

Within the preferred embodiment of the present invention, the series of second spacer layers 34a, 34b, 34c, 34d, 34e and 34f may be formed employing methods and materials generally analogous or equivalent to the methods and materials employed for forming the series of first spacer layers 28a, 28b and 28c.

Finally, there is also shown within the schematic cross-sectional diagram of FIG. 6, and formed within the active region 11a of the semiconductor substrate, a pair of source/drain regions 20a' and 20b' which incorporates the pair of lightly doped extension regions 20a and 20b as illustrated within the schematic cross-sectional diagram of FIG. 5.

As is understood by a person skilled in the art, the pair of source/drain regions 20a' and 20b' is formed incident to an additional and heavier dose ion implanting of the pair of lightly doped drain extension regions 20a and 20b, while the same are further masked with the series of second spacer layers 34a, 34b and 34c.

Upon forming the semiconductor integrated circuit microelectronic fabrication whose schematic cross-sectional diagram is illustrated in FIG. 6, there is formed in accord with the present invention a storage capacitor formed with enhanced capacitance within a memory cell structure of decreased dimensions. The present invention realizes the foregoing object by forming the storage capacitor within and extending above a laterally asymmetric trench within an isolation region within the semiconductor integrated circuit microelectronic fabrication, where a capacitor node layer within the storage capacitor contacts a sidewall of an active region of the semiconductor substrate. The present invention similarly also provides advantage insofar as there may be formed above the storage capacitor an interconnect layer, further optimizing areal space utilization within the semiconductor integrated circuit microelectronic fabrication.

As is understood by a person skilled in the art, the preferred embodiment of the present invention is illustrative of the present invention rather than limiting of the present invention. Revisions and modifications may be made to methods, materials, structures and dimensions through which is provided a semiconductor integrated circuit microelectronic fabrication in accord with the preferred embodiment of the present invention, while still providing a method for fabricating a capacitor structure in accord with the present invention, and a capacitor structure fabricated in accord with the method, further in accord with the accompanying claims.

What is claimed is:

1. A capacitor structure comprising:

a semiconductor substrate having formed therein an isolation region adjoining an active region of the semiconductor substrate;

a laterally asymmetric trench formed within the isolation region and bounded at one of its sides by a sidewall of the active region of the semiconductor substrate and at the remainder of its sides by a remaining portion of the isolation region;

a capacitor node layer fanned into the laterally asymmetric trench, where the capacitor node layer contacts the sidewall of the active region of the semiconductor substrate and rises above the active region of the semiconductor substrate;

a capacitor dielectric layer fanned upon the capacitor node layer;

a capacitor plate layer formed upon the capacitor dielectric layer;

an isolation dielectric layer formed upon the capacitor plate layer; and an interconnect layer formed over the isolation dielectric layer.

2. The capacitor structure of claim 1 wherein the laterally asymmetric trench has a bidirectional linewidth within the isolation region of from about 0.41 to about 0.54 microns and a depth within the isolation region of from about 2000 to about 1000 angstroms.

3. The capacitor structure of claim 1 wherein the capacitor node layer is a conformal layer formed to a thickness of from about 1000 to about 2000 angstroms.

4. The capacitor structure of claim 1 further comprising a field effect transistor (FET) device formed into the active region of the semiconductor substrate, where the field effect transistor (FET) device has a source/drain region electrically connected wit the capacitor node layer at the sidewall of the active region of the semiconductor substrate.

* * * * *